(12) United States Patent
Arianpour et al.

(10) Patent No.: US 8,022,292 B2
(45) Date of Patent: Sep. 20, 2011

(54) PHOTOVOLTAIC DEVICE EMPLOYING A RESONATOR CAVITY

(75) Inventors: Ashkan A. Arianpour, San Diego, CA (US); James P. McCanna, San Diego, CA (US); Joshua R. Windmiller, Del Mar, CA (US); Semeon Y. Litvin, Encinitas, CA (US)

(73) Assignee: SolASE Corporation, San Diego, CA (US)

( * ) Notice: Subject to any disclaimer, the term of this patent is extended or adjusted under 35 U.S.C. 154(b) by 403 days.

(21) Appl. No.: 11/768,165

(22) Filed: Jun. 25, 2007

(65) Prior Publication Data

US 2008/0128023 A1 Jun. 5, 2008

Related U.S. Application Data

(60) Provisional application No. 60/848,690, filed on Oct. 2, 2006.

(51) Int. Cl.
*H01L 31/00* (2006.01)

(52) U.S. Cl. ........................................................ 136/261

(58) Field of Classification Search .................. None
See application file for complete search history.

(56) References Cited

U.S. PATENT DOCUMENTS

| | | | |
|---|---|---|---|
| 3,967,255 A | 6/1976 | Oliver et al. | |
| 4,818,337 A | 4/1989 | Barnett et al. | |
| 5,153,760 A | 10/1992 | Ahmed | |
| 5,969,475 A | 10/1999 | Friend et al. | |
| 6,252,287 B1 * | 6/2001 | Kurtz et al. | 257/461 |
| 6,380,480 B1 | 4/2002 | Norimatsu et al. | |
| 6,399,873 B1 | 6/2002 | Sano et al. | |
| 6,476,412 B1 | 11/2002 | Kano | |
| 6,483,021 B2 | 11/2002 | Saito | |
| 6,645,833 B2 | 11/2003 | Brendel | |
| 6,689,949 B2 | 2/2004 | Ortabasi | |
| 7,541,537 B2 * | 6/2009 | Madigan | 136/247 |
| 2003/0221717 A1 * | 12/2003 | Dessel | 136/206 |
| 2004/0109328 A1 | 6/2004 | Dahl et al. | |
| 2004/0229394 A1 * | 11/2004 | Yamada et al. | 438/66 |
| 2005/0155641 A1 | 7/2005 | Fafard | |
| 2005/0162606 A1 | 7/2005 | Doane et al. | |
| 2005/0247339 A1 | 11/2005 | Barnham et al. | |
| 2006/0169989 A1 | 8/2006 | Bhattacharya et al. | |
| 2007/0113887 A1 | 5/2007 | Laih et al. | |

OTHER PUBLICATIONS

J. R. Windmiller, Vertical Cavity Surface Emitting Lasers: Design, Theory, and Applications, ECE 185: Lasers & Modulators, Jun. 7, 2006, Spring Quarter 2006, University of California, San Diego, Irwin & Joan Jacobs School of Engineering, Dept. of Electrical and Computer Engineering.

Viorel Badescu & Peter T. Landsberg, Influence of Photon Recycling on Solar Cell Efficiencies, Semicond. Sci. Technol., 1997, 1491-1497, 12, IOP Publishing Ltd., UK.

* cited by examiner

*Primary Examiner* — Jessica L Ward
*Assistant Examiner* — Steven Ha
(74) *Attorney, Agent, or Firm* — Timothy W. Fitzwilliam; Lewis Kohn & Fitzwilliam LLP

(57) ABSTRACT

A photovoltaic device utilizing a gain means and an amplification means to intake and convert incident light/photons to greater intensities of highly coherent and monochromatic photons whereby said photons are passed to a resonating means and absorption means, allowing for said photons to be absorbed with increased conversion efficiency.

17 Claims, 13 Drawing Sheets

PHOTOVOLTAIC DEVICE EMPLOYING A RESONATOR CAVITY

RELATED APPLICATIONS

This application claims priority from U.S. Provisional Application Ser. No. 60/848,690 by Arianpour, et al., entitled "Photovoltaic Device Employing a Resonator Cavity" filed on Oct. 2, 2006, the contents of which are incorporated herein in their entirety by this reference.

FIELD OF THE INVENTION

This invention is directed to methods and compositions for photovoltaic devices employing a resonator cavity.

BACKGROUND

Photovoltaic cells are a promising energy harvesting technology. Photovoltaic or solar cells provide a means to convert light and generally abundant sun light to electricity. Photovoltaic cells operate on the general principle where light, which in the physical sense is a flux of photons, excites one or more electrons from its valence band to a conduction band in a semiconductor. These electrons are then harvested and stored in a battery or capacitor, or can be used to drive a load. Prior incremental improvements in photovoltaic cell efficiency came at the expense of exotic materials or manufacture of the device. Unfortunately, the present technology is challenged by its inefficiency and thereby renders fossil energy resources economically attractive.

U.S. patent application No. 2005/0155641, by Fafard et al. and titled Solar Cell with Epitaxially Grown Quantum Dot Material, describes a photovoltaic solar cell comprising a plurality of subcells. While the device utilizes Distributed Bragg Reflectors and mentions the use of reflectivity to change the absorption properties, the patent application fails to describe how this can be accomplished. In addition, the patent application neither describes the use of Distributed Bragg Reflectors to trap and recycle light, nor the use of a quantum gain medium to create resonance and thereby a feedback system.

U.S. patent application No. 2005/0247339, by Barnham et al. and titled Method of Operating a Solar Cell, describes a device for the method of operating a solar cell. The invention requires greater than 30 quantum wells within two pieces of bulk semiconductor and requires highly concentrated sunlight on the order of 30-100 suns. While a DBR is incorporated on the bottom of the cell to reflect unused photons back through the device, the invention fails to disclose a resonating means whereby a photon is recycled. In light of the prior art there is a need for . . . .

SUMMARY OF THE INVENTION

Disclosed is a photovoltaic device utilizing a gain means, and an amplification means to intake and convert incident light/photons to greater intensities of highly coherent and monochromatic photons. Such produced photons are passed to a resonating means and absorption means, whereby the photons are absorbed with increased conversion efficiency.

In an alternative embodiment, the photovoltaic device is incorporated into an electronic device wherein said photovoltaic device powers said electronic device.

In an alternative embodiment, the photovoltaic device is a photodetector wherein said photovoltaic device identifies the presence or intensity of light.

DETAILED DESCRIPTION OF THE INVENTION

Figure 1:
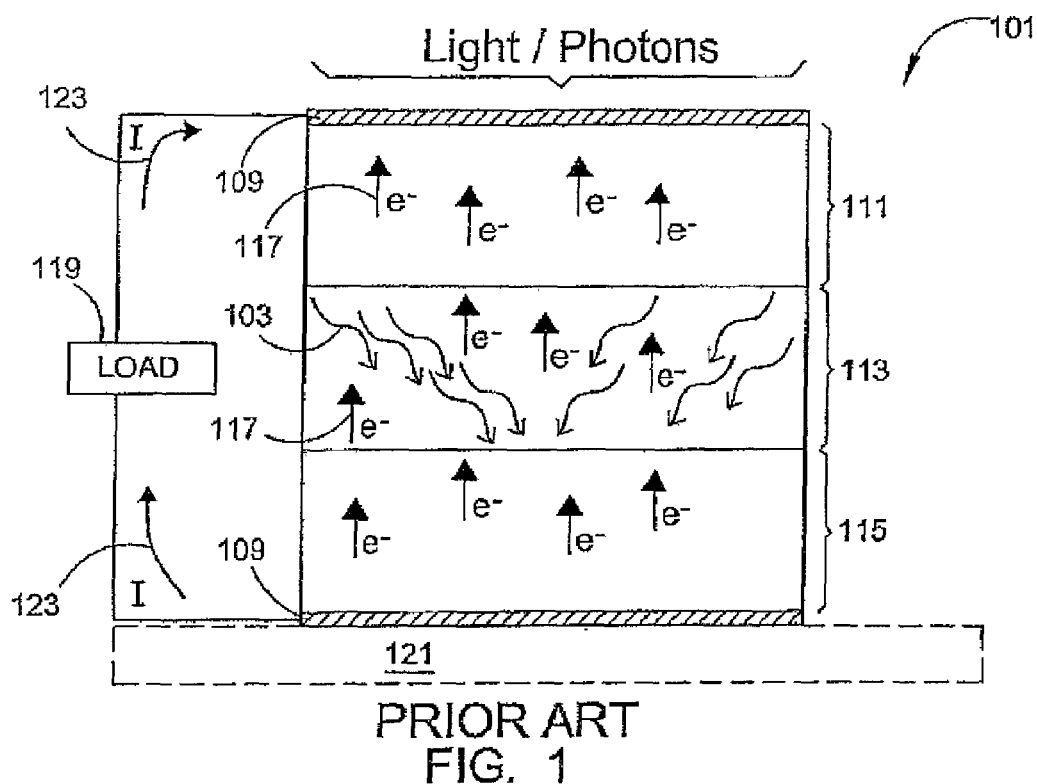
FIG. 1 illustrates a prior art photovoltaic device.
Figure 9:
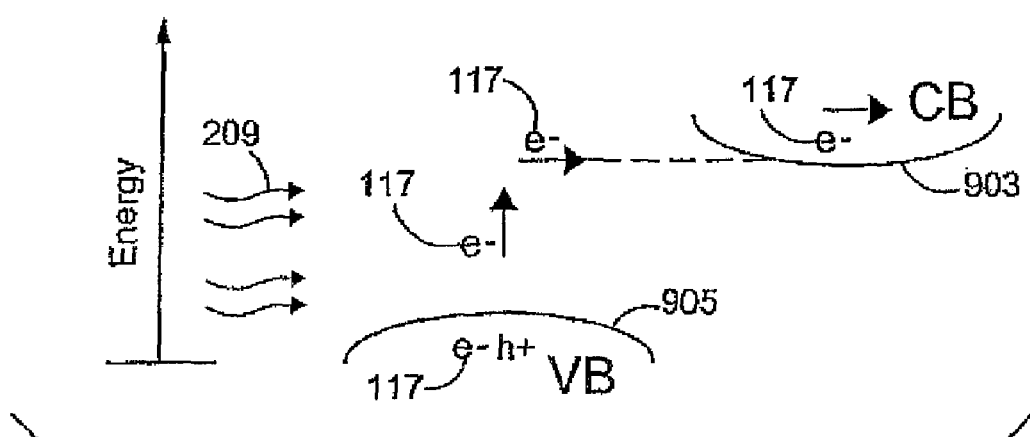
FIG. 9 is an energy domain representation (or band diagram) of an indirect bandgap material without the insertion of a quantum well.
Figure 10A:
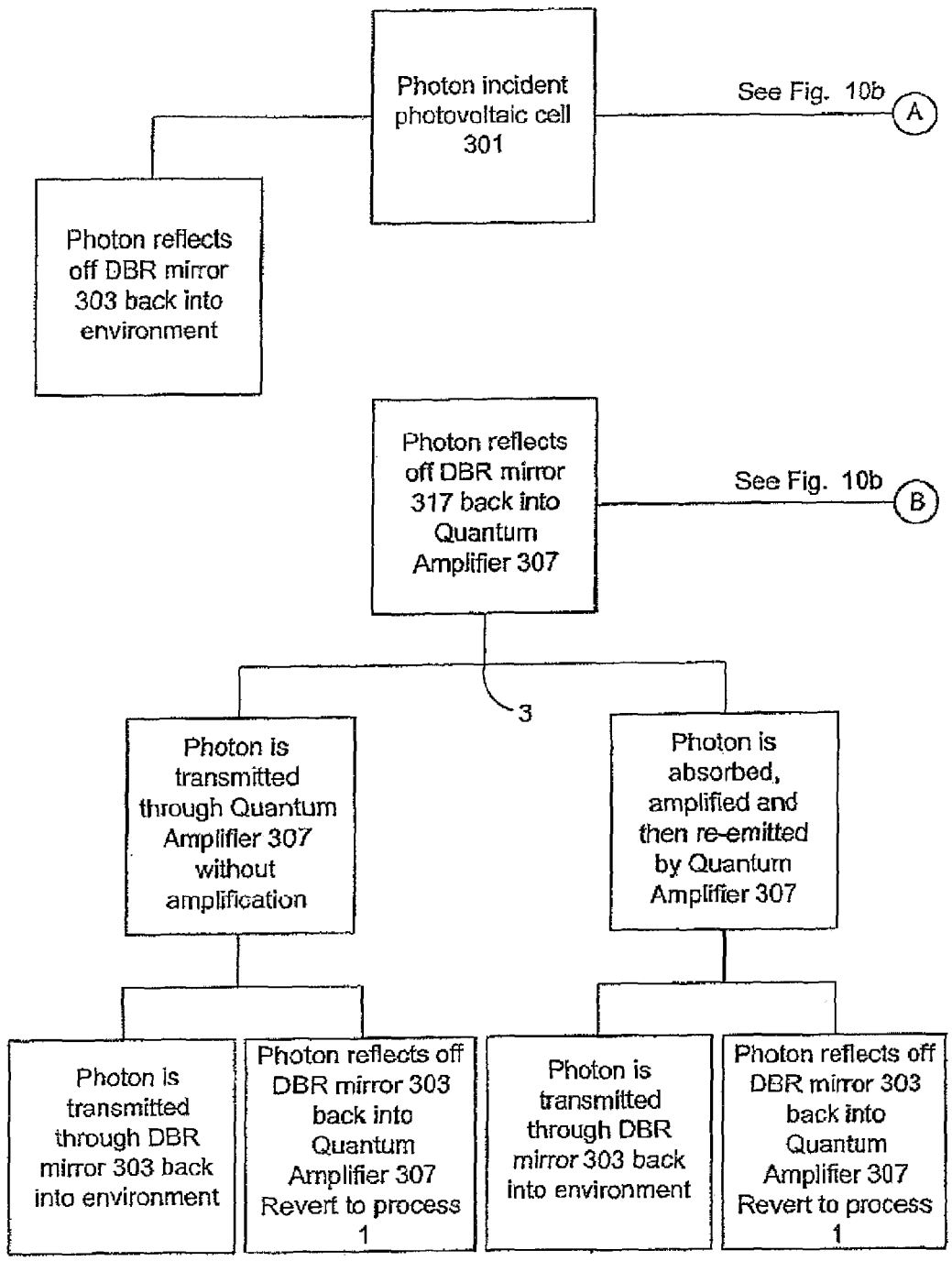
FIGS. 10a-f depict a flow chart representing the various routes a photon can travel in the photovoltaic device.
Figure 10B:
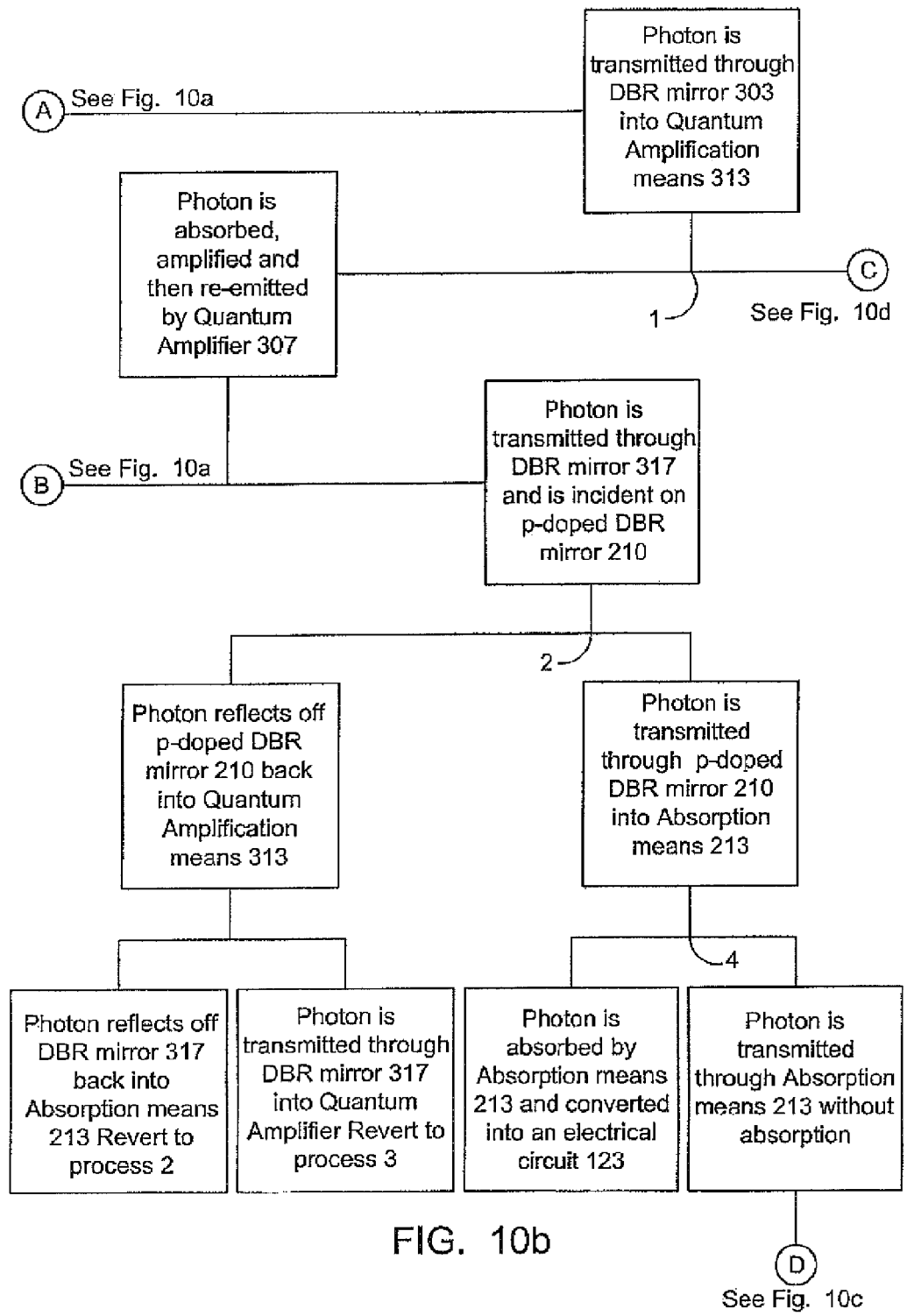
Figure 10C:
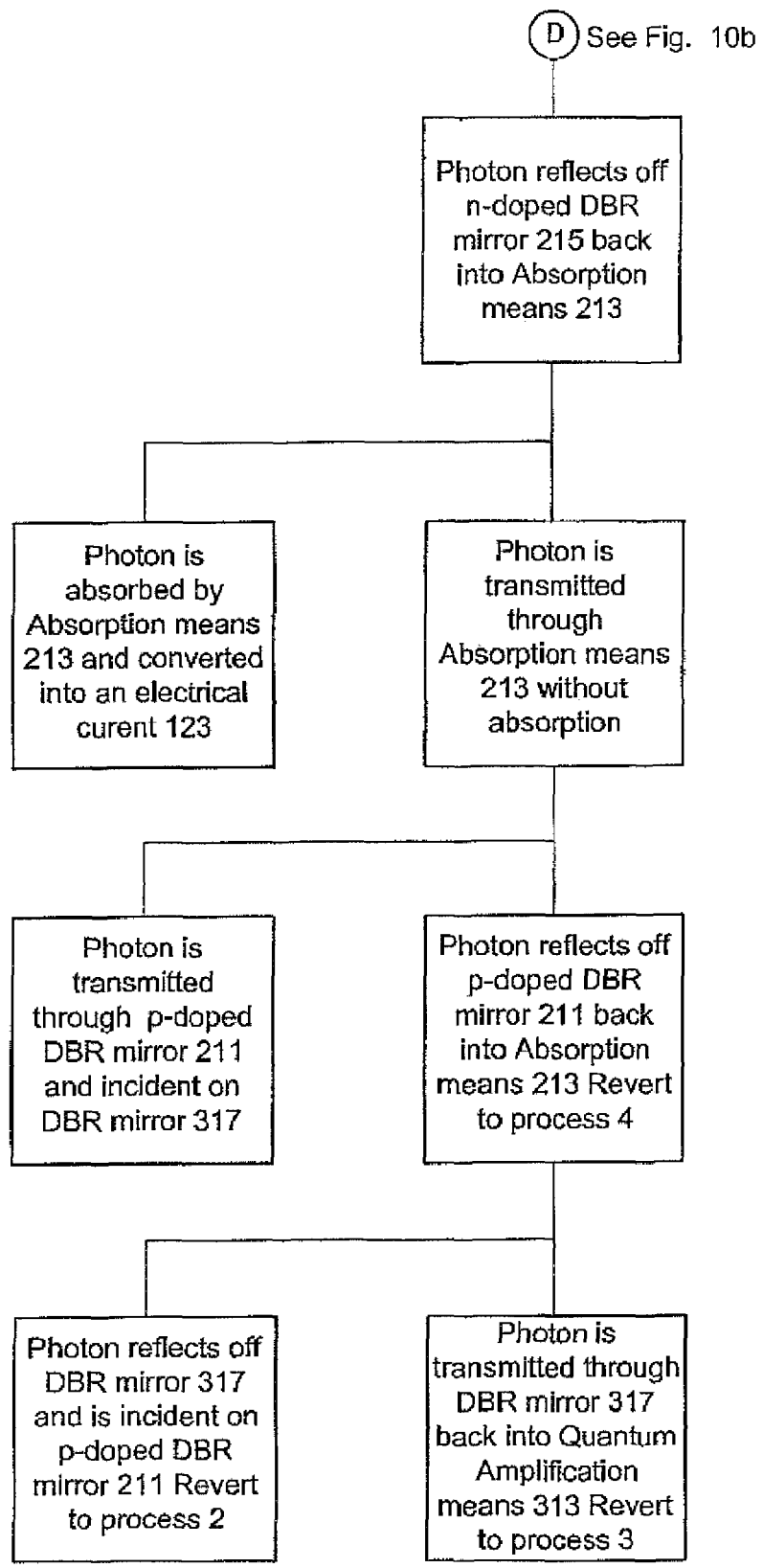
Figure 10D:
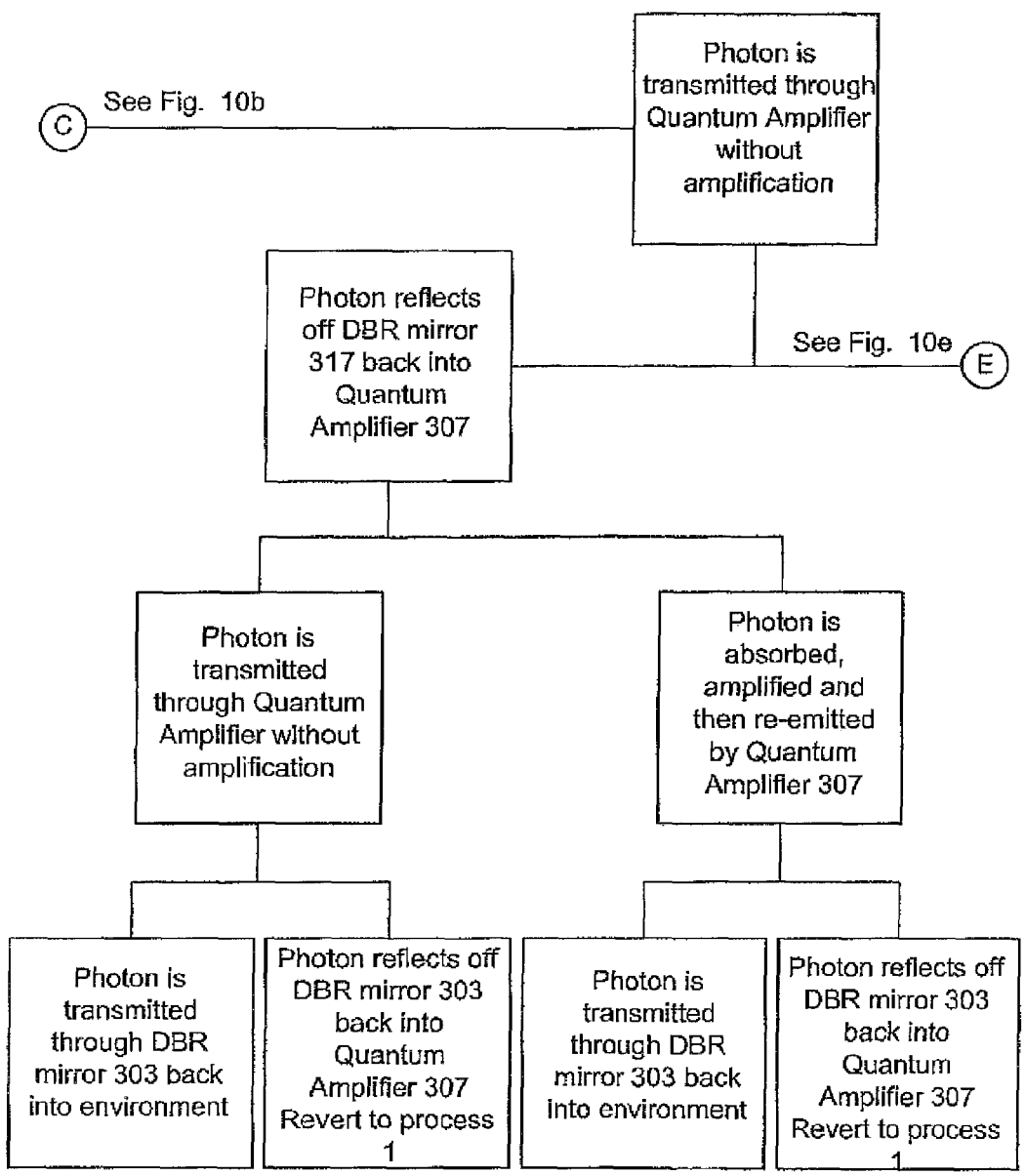
Figure 10E:
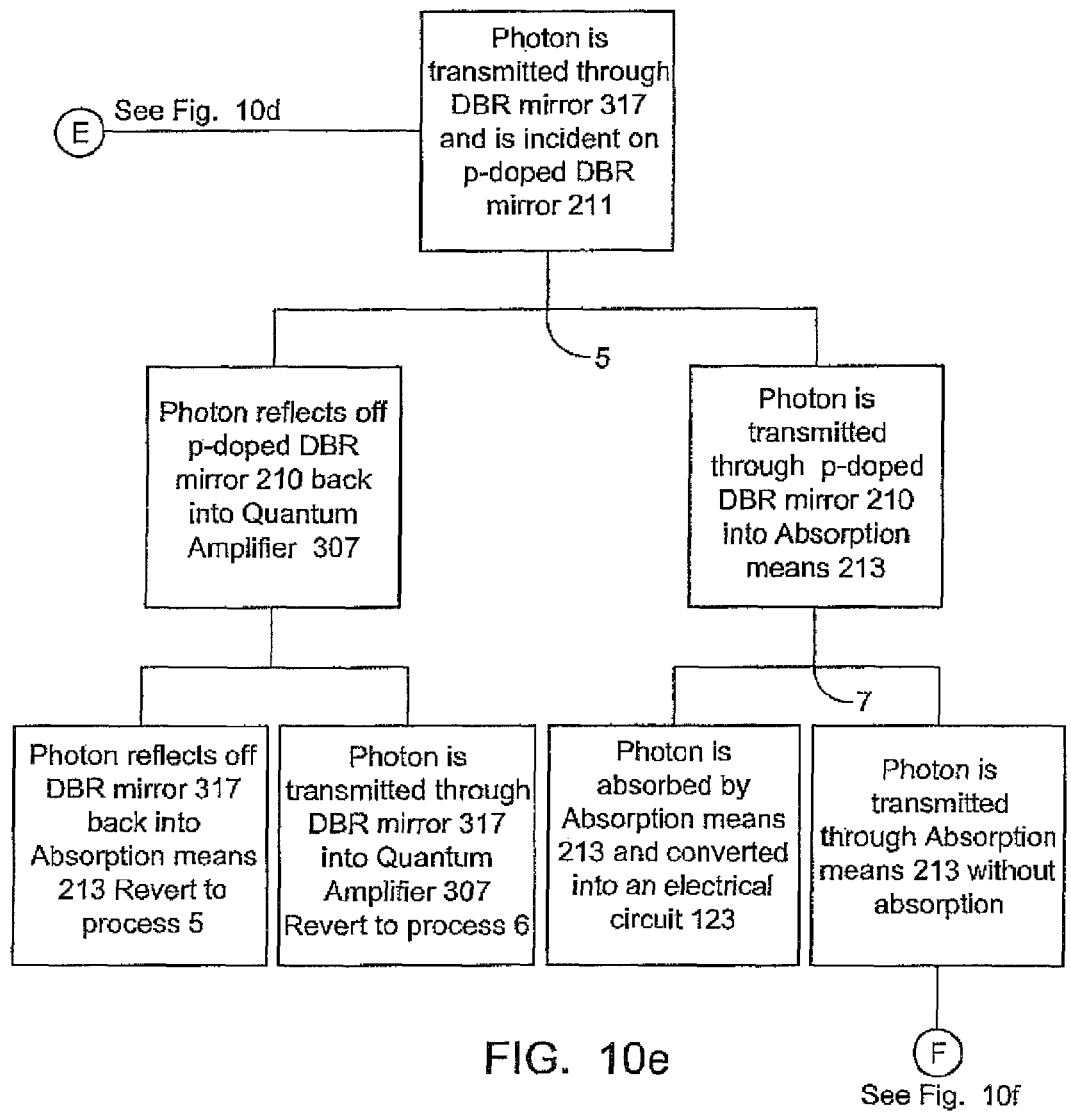
Figure 10F:
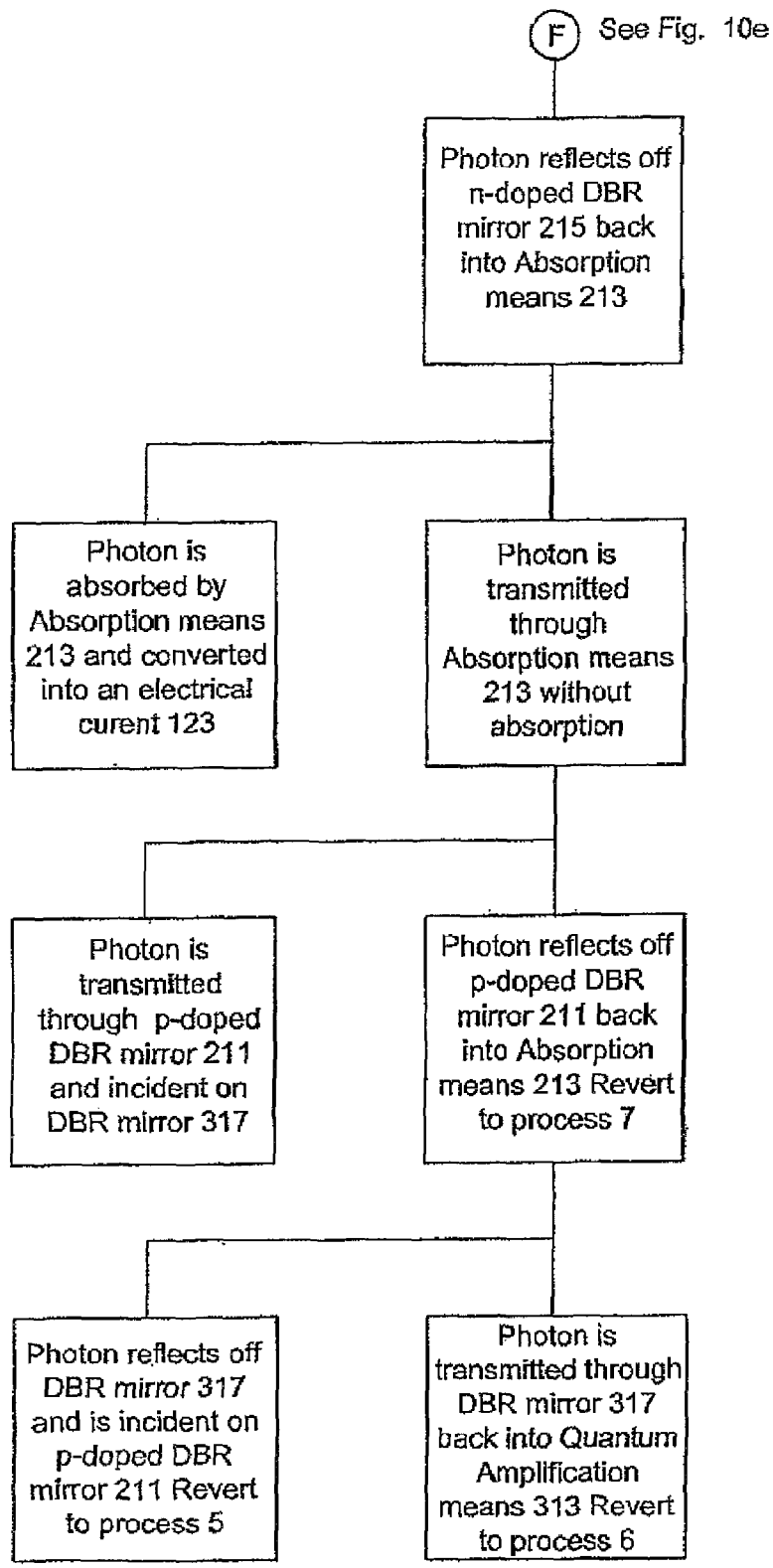

FIG. 1 illustrates a photovoltaic device 101 of the prior art. In this device, the bulk absorption means 113 is exposed to light/photons 103. Typically the absorption means 113 is fabricated out of silicon and is configured to be juxtaposed between n-doped material 115, having excess electrons, and p-doped material 111, having excess electron holes. The absorption means 113 of the prior art devices is relatively thick, sometimes approaching up to a millimeter. This size is inefficient and therefore more expensive. As further illustrated in FIG. 9, the basic premise of operation of a photovoltaic cell is to excite an electron 117 from its valence band 905 to its conduction band 903. The energy for such excitation is derived from a photon 103. This excited electron is useful in a circuit, for instance, in the form of a useful flow of current.

Certain wavelengths of light/photons 103 have sufficient energy to energize electrons 117 in the absorption means 113 to leave their valence band 805 and move to the conduction band 803. Notably, light/photons 103 that do not meet the energy levels required to transition an electron 117 from valence band 805 to conduction band 803 may be absorbed, transmitted, or scattered and generate undesirable heat. The relation between photon energy and wavelength is given by the formula $E=hc/\lambda$ where E is the photon energy, h is Planck's constant, c is the speed of light in vacuum, and $\lambda$ is the photon wavelength. As such, there is an inverse relationship between photon wavelength and its inherent energy. The photon energy E is given in electron volts, and accordingly, if the photon has equal or greater energy than the bandgap energy of the material, it will be absorbed by an electron, which, in turn, is excited from the valence band 805 to the conduction band 803 of the semiconductor medium.

Similarly, light/photons 103 that exceed the energy levels required to transition electron 117 from valence band 805 to conduction band 803 also generate heat with the energy that is in excess of the energy required to move electron 117 into conduction band 803. Finally, light/photons 103 that are [n] multiples of the energy required to transition electron 117 from valence band 805 to conduction band 803, transition [n] electrons from their respective valence bands 805 to conduction band 803. As light/photons 103 are exposed to the absorption means 113 some of them will come in proximity with or excite electrons 117 thereby giving them more energy and moving some of them into the conduction band 803.

These electrons 117 leave behind electron holes that can be considered as regions where there is a lack of electrons in the lattice structure and can be thought of and dealt with as separate particles. These electron holes are the majority carriers in the p-doped material 111. The complimentary n-doped material 115 provides excess electrons to facilitate the current flow 123 through at least two leads 109 across a load 119. It is the case that the described prior art device 101 has a relatively low efficiency factor that is insufficient to be a commercially viable option for a number of utilitarian applications. Many of the incident photons 103 simply generate heat and relatively few move electrons from their valence band to the conduction band to produce useful current. The result is a relatively low conversion efficiency of photons into excited electrons.

Figure 2:
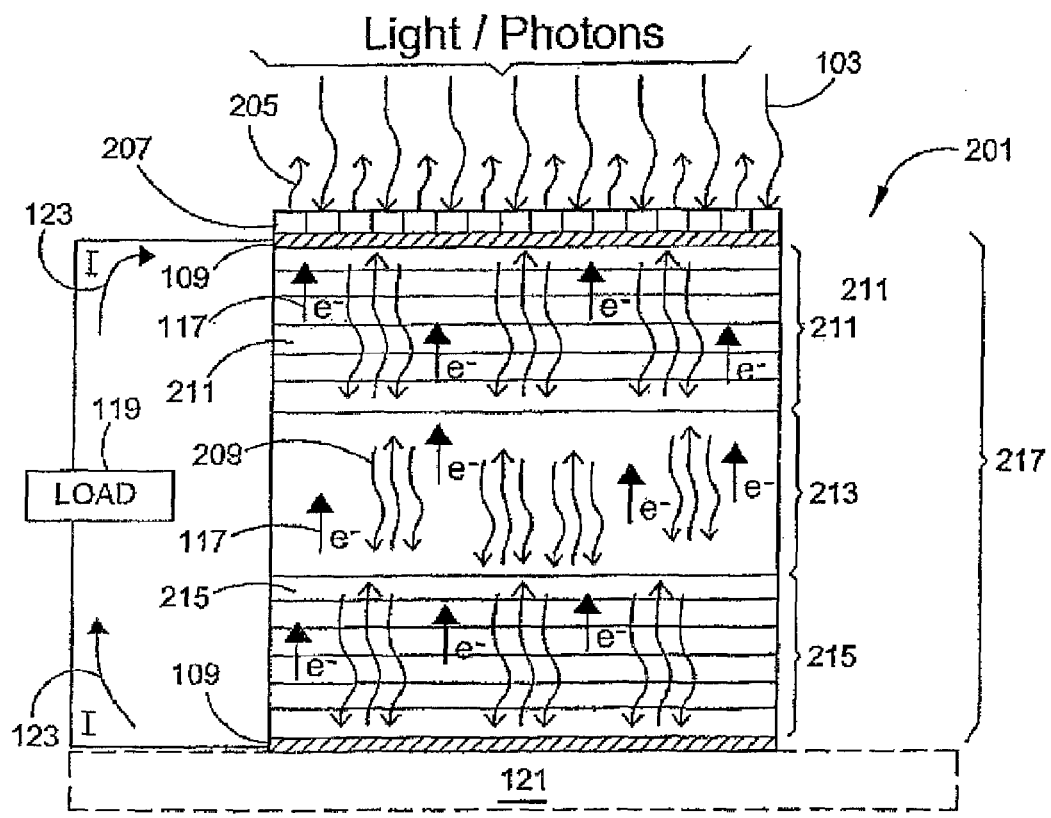
FIG. 2 illustrates a photovoltaic device using a resonating means and an absorption means.

The disclosed embodiments provide for a device and method of configuring the same while yielding a substantially greater efficiency in a photovoltaic cell. One embodiment of the photovoltaic device 201 is a light filter 207 configured to block incident light lying in a specified spectrum from entering the device. While the preferred embodiment encompasses an infrared light filter, FIG. 2, the light filter can filter the entire spectrum of wavelengths, including, but not limited to, visible light, ultraviolet light, or infrared light. Light filter 207 is configured to pass through the desirable light/photons 209 from the superset of the incoming incident light/photons 103 and reject the undesirable light/photons 205.

Figure 8:
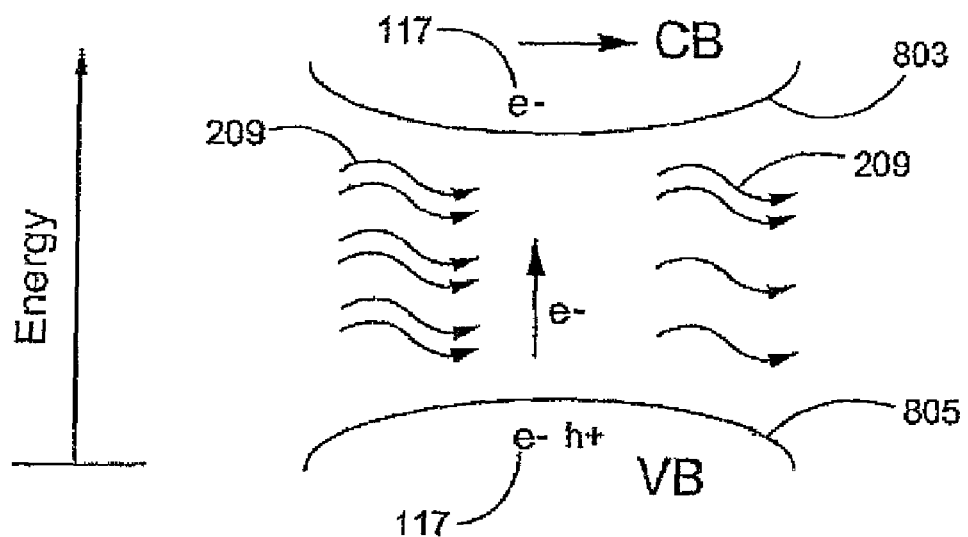
FIG. 8 is an energy domain representation (or band diagram) of a direct bandgap material without the insertion of a quantum well.

In a photovoltaic cell, this minimizes the unproductive excitation of electrons 117 in the absorption means 113 and therefore minimizes the often undesired heating effects caused by such light/photons 205 lying within the infrared or other undesired spectrum. Namely, allowing light/photons 205 that do not have the requisite energy to elevate or move electrons 117 from the valence band 805 to conduction band 803, as shown in FIG. 8 and explained above, is unproductive because such light photons 205 result in the absorption of energy and the generation of heat.

Heat is generally undesirable because it radiates throughout the device and system, and it generally accelerates aging, creates stress, contributes to malfunction, affecting the semiconductor operational dynamic and as a consequence produces lower conversion efficiency. In implementations where heat is a desirable byproduct, light filter 207 is not employed or it is configured to meet the desired effects.

The present invention also encompasses a resonating means 217 comprising at least two photon reflective means and is attached to a support means 121. While the preferred embodiment of the at least two photon reflective means employ Distributed Bragg Reflector (DBR) mirrors 211 and 215, FIG. 2, a wide variety of mirrors or reflective surfaces can be used. Said DBR mirrors have semiconductor properties and they can be selectively p-doped, neutral, or n-doped in the fabrication process. In the preferred embodiment of photovoltaic device 201, the p-doped DBR mirror 211 and n-doped DBR mirrors 215 are fabricated as DBR mirrors with its respective n-doped and p-doped properties.

In an alternative embodiment, DBR mirrors could be selectively fabricated with a reflection coefficient of nearly one (~1) to nearly (~0), appreciating the physical limitations and the asymptotic challenges and practical limitations of creating a device that approaches perfect reflectivity or perfect admittance. DBR mirrors are fabricated using a periodic stacking of two different types of semiconductors with varying refractive indices. The thickness of each layer in the stack is given by $t=\lambda_0/(4n)$, where $\lambda_0$, is the vacuum wavelength of the photon and n is the refractive index of the material. By stacking a sufficient number of layer pairs, the desired reflectivity can be obtained and optical feedback can be realized. The reflection coefficient of the DBR is given as: $R_N=|r_N|^2=|C|^2/[|C|^2+\{\sin(K\Lambda)/\sin(NK\Lambda)\}^2]$ where r is the reflectivity as a function of N semiconductor pairs, C is the coupling constant, and $K\Lambda$ is the Bloch wave number.

The present invention encompasses a support means 121 wherein such support means is attached to the resonating means 217 and provides the structural base of the photovoltaic device. While a semiconductor wafer is the preferred embodiment of the support means 121, said means can also include, but is not limited to, windshield, glass, carbon fiber, organic compound, polymer, plastic, or silicon.

The difference between direct bandgap and indirect bandgap materials is of importance to the present invention. In an indirect bandgap material, the region of minimum potential energy in the conduction band does not correspond to the region of maximum potential in the valence band, and hence, there is a difference in momentum associated with a transition between these two regions. Indirect bandgap materials, illustrated in the energy domain in FIG. 9, do not re-emit an excited electron back to the valence band 905, if such electron is moved from the valence band 905 to the conduction band 903. In other words, an indirect bandgap material is relatively stable because an electron cannot easily decay from the conduction band 903 to the valence band 905 without changing its constituent momentum.

For practical purposes of this disclosure, once a photon 209 excites an electron 117 to move from its valence band 905 to its conduction band 903, this electron does not easily re-emit or move back to its valence band 905. In other words, in an indirect bandgap material, radiative recombination of the electron-hole pair does not easily occur. This is a desirable characteristic because the goal of a photovoltaic device is to separate charge and harvest electrons to create current 123 across a load 119.

In addition to the resonating means 217, the present invention encompasses an absorption means 213, juxtaposed between the at least two photon reflective means employed by a p-doped DBR mirror 211 and an n-doped DBR mirror 215. Conveniently, silicon material has indirect bandgap properties and in the preferred embodiment can be deposited in a thin manner to create an absorption means 213. Due to its indirect bandgap properties, an electron excited to the conduction band 903 does not easily descend back to its valence band 905. Silicon, for example, is a common material that requires a photon of energy of at least 1.12 eV (electron volts) at 300K to move an electron from its valence band 905 to its conduction band 903. Other materials with indirect bandgap properties can be incorporated into the absorption means 213 including, but not limited to, Silicon, Germanium, Silicon Germanium, Aluminum Gallium Arsenide, Indium Gallium Arsenide, Copper Indium Selenide, or Copper Indium Gallium Selenide.

In addition to the absorption means 213, the present invention also encompasses a gain means 311 comprising at least two photon reflective means wherein the preferred embodiment of said at least two photon reflective means includes DBR mirror 303 and DBR mirror 317. The at least two photon reflective means can include, but is not limited to, a p-doped DBR mirror, an n-doped DBR mirror, or a neutral DBR mirror. In an alternative embodiment, DBR mirrors could be selectively fabricated with a reflection coefficient of nearly one (~1) to nearly (~0), appreciating the physical limitations and the asymptotic challenges and practical limitations of creating a device that approaches perfect reflectivity or perfect admittance.

In addition to the gains means 311, the current invention encompasses an amplification means 313 juxtaposed between the at least two photon reflective means of the gains means 311. The amplification means 313 comprises a quantum amplifier 307 juxtaposed between quantum confinement layers 305. The quantum amplifier 307 is used to generate and increase the intensity of photons at a certain wavelength (given by the fabrication material and process) that are more likely to be absorbed by the absorption means 213. As described above, quantum amplifier 307 could be formed as a quantum well(s), quantum dot(s) or a quantum wire(s).

Quantum wells, quantum wires and quantum dots provide the means to excite an electron from its valence band 805 to its conduction band 803 and comprise the term quantum amplifiers 307. A quantum amplifier 307 is incorporated into the amplification means 313 and comprises very thin layers of direct bandgap materials, on the order of 100 angstroms or less. Such quantum amplifiers are significantly more efficient at absorbing and re-emitting photons than bulk material. A quantum amplifier 307 must be embedded in a relatively thick material known as a quantum confinement layer 305, QCL 305, of higher bandgap energy than the quantum amplifier 307 in order to function efficiently as a gain means 311. The QCL 305 separates the quantum amplifier 307 from all adjacent structures including, DBR mirrors and other quantum amplifiers 307. The QCL 305 is comprised of material with indirect bandgap properties including, but not limited to, Aluminum Gallium Arsenide, Aluminum Gallium Nitride, Aluminum Indium Arsenide, Aluminum Indium Phosphide, Aluminum Indium Antimonide, Zinc Sulfide, or Cadmium Sulfide.

In the preferred embodiment, the quantum amplifier 307 employs a direct bandgap material, wherein the region of minimum potential energy in the conduction band corresponds to the region of maximum potential in the valence band, and hence, there is no difference in momentum associated with a transition between these two regions. As illustrated in FIG. 8, in the energy domain, such materials are conversely unstable. In a material having direct bandgap properties, a sufficient number of electrons 117 excited from their valence band 805 to the conduction band 803 create a state of population inversion.

In direct bandgap materials, a population inversion state is resolved by electrons 117 re-emitting back to their valence band 805. When this happens the process of stimulated emission occurs whereby a passing photon will induce an excited electron to decay to the valence band loosing energy in the form of a photon. This is the essence of amplification as it creates a plurality of photons for a single incident photon. This can be easily accomplished because, unlike indirect bandgap materials, an excited electron does not have to change its intrinsic momentum in order to decay to the valence band. As more incident photons 209 excite electrons 117 back to the conduction band 803, another population inversion state is created and the cycle continues, driven by such incident light photons 209.

Gallium Arsenide is one example of a direct bandgap semiconductor that can be incorporated into the quantum amplifier 307 and requires a photon of energy of at least 1.42 eV (electron volts) at 300K to move an electron from its valence band 805 to its conduction band 803. Other materials with direct bandgap properties that can be incorporated into the quantum amplifier 307 include, but are not limited to, Gallium Nitride, Indium Arsenide, Indium Phosphide, Indium Antimonide, Cadmium Telluride, or Cadmium Selenide. As such, electrons 117 in direct bandgap materials will readily re-emit photons, as they decay from the conduction band 803 to valence band 805.

Figure 7:
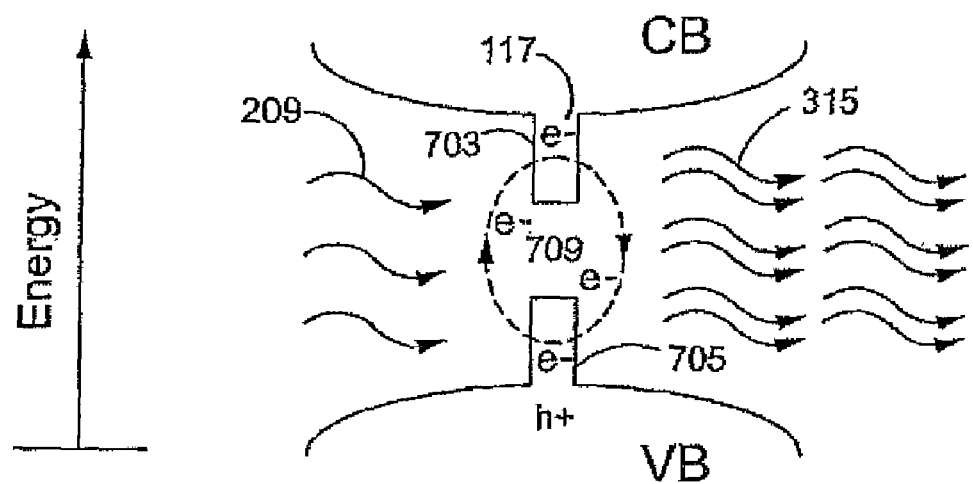
FIG. 7 is an energy domain representation (or band diagram) of a direct bandgap material sandwiching a quantum well.

FIG. 7, representing a direct bandgap material, illustrates a one dimensional confinement 709 as a notch in the band diagram. Such a structure will support an accumulation of electrons in the notch region, and, since the material is sufficiently thin, quantum mechanical effects have to be considered. Namely, the dimensional variations in the electron's wavefunction have a significant effect on the emission of the device and create an electron cloud between the valence band 705 and conduction band 703. This aggregate electron cloud shown in 709 is actually an overlap of the respective wave-functions of the electron holes in the valence band 705 and the electrons in the conduction band 703. This overlap in the hole-electron wave-function can only be accomplished with a material of a substantially thin dimension (i.e. structures such as a quantum well, quantum wire, or quantum dot). Given a thin amount of material, electrons in the conduction band will have a greater likelihood (i.e. higher probability) of recombination with holes in the valence band 705 thereby emitting a photon and giving rise to substantially high conversion efficiency as compared with bulk absorption material, as used in the prior art. A desirable byproduct of such clouds 709, which is a large collective of electrons going up to and down from the conduction band 703 stimulated by incident photons 209, are the photons 315 that they generate.

Photons, generated by electrons 117 going from one orbit to another in the same material stimulated by incident photons 209, will have the same wavelength and phase. As such, cloud 709 generates a greater intensity of photons 315 that are highly coherent (uniform phase) and highly monochromatic (same wavelength). In sum, by using incident light/photons 209 as an energy source or pump to drive a direct bandgap material into a cyclic state of population inversions as well as the use of the aforementioned DBR mirrors for feedback allows for generation of photons 315 that are highly intense, highly monochromatic and highly coherent. This process is known as Amplified Stimulated Emission (ASE).

At such geometries, physical characteristics and behavior of materials are better understood in the domain of quantum mechanics, because a sufficiently small amount of material comprising a quantum amplifier 307 behaves differently than a larger amount of the same material (i.e. bulk material). According to the quantum mechanical principles, a sufficiently small thickness of a material is effectively constrained in one, two, or three dimensions. Originating from the Uncertainty Principle, quantum mechanical effects come into play when the material is confined to a region on the order of $x=[\hbar^{2}/(mk_{B}T)]^{1/2}$ where $\hbar =h/(2\pi)$, m is the effective mass of the electron, $k_B$ is Boltzmann's constant, and T is the operational temperature in Kelvin.

Figure 6:
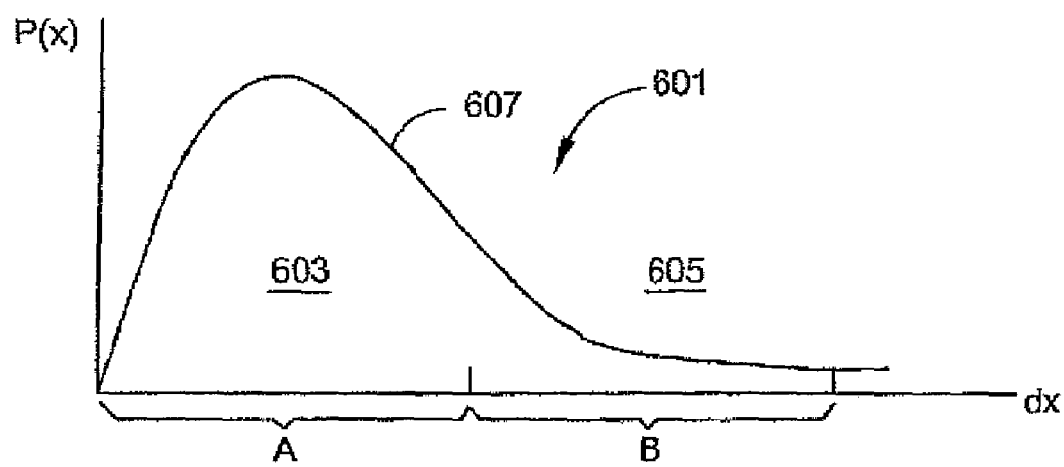
FIG. 6 is a graph illustrating the probability density function of finding an electron in the vicinity of an atom (located at the origin) as a function of distance from the atom.

In that perspective of quantum mechanics, an electron is not viewed in a three dimensional form as a particle, but as a wave of energy having a wavelength given by the de Broglie Wavelength, namely $\lambda=h/p=[h/(mv)][1-v^2/c^2]^{1/2}$ where p is the electron's momentum, m is its effective mass, and v is its velocity. As such, when incident light/photons 209 having sufficient energy reaches the material of a quantum amplifier 307, such photons 209 are more likely to meet and excite an electron in the material of the quantum amplifier 307. As shown in FIG. 6, the probability density increases to the order of the area 603 under the curve 607. In other words, applying direct bandgap materials in sufficiently thin geometry, thereby constructing a quantum amplifier 307, limits the movement of its electrons 117 by one, two, or three dimensions and provides for a greater probability of a photon exciting an electron from its valence band 705 to its conduction band 703. Whereas in the non-quantum amplifier structures, the probability of a photon meeting an electron is considerably lower and is characterized by region 605 shown in FIG. 6.

Accordingly, using quantum amplification materials with direct bandgap properties allows incident light/photons 209 to be used as an energy source to generate high intensity, coherent, and monochromatic photons 315 that are configured for absorption in the resonating means 217 and absorption means 213 or bulk absorption means 503.

Photons 315 proceed to the DBR mirror 317 of the gain means 311. The DBR mirror in this embodiment does not need to conduct electrons and is therefore neutral. DBR mirror 317 has a reflection coefficient, which for this example and description is 0.5 (although the exact reflection coefficient does not matter for purposes of this disclosure). Therefore half or some portion of the photons 315 is reflected back toward the quantum amplifier 307 to once again be absorbed or perturb electron decay in the case of population inversion and resultantly release another clone photon and thereby intensify the emission of the highly coherent, monochromatic photons 315 in the ASE process.

Photons 315 that are not absorbed by quantum amplifier 307 are then reflected again at DBR mirror 303 and the iterative process continues and can be considered as a form of optical feedback. For purposes of example, the reflection coefficient of DBR mirror 303 is 0.5. However, the exact reflection coefficient does not bear on this disclosure or scope of this disclosure. Similarly, the doping of the DBR mirror 303 in this embodiment is not necessary, but possible and desirable in some applications.

The iterative process described above is continuously supplemented and driven by new light/photons 103, which can be optionally filtered by light filter 207 to reject non-productive and heat generating light/photons 205. The new incident photons 209 from the environment are not as coherent or monochromatic as the photons emitted from the quantum amplifier 307, but photons 209 are a continuous source of energy for generation of intense, highly monochromatic and coherent photons 315.

Figure 3:
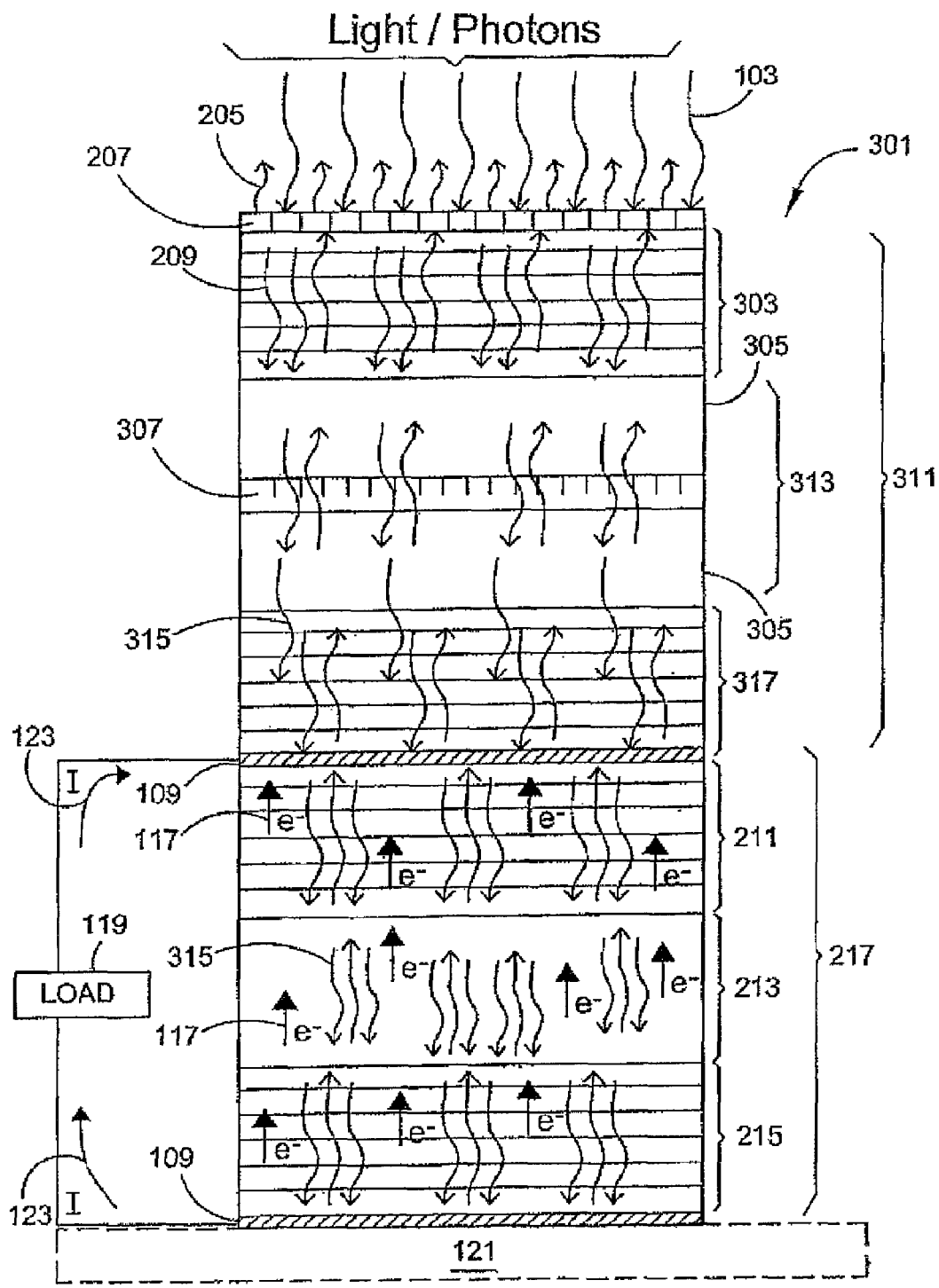
FIG. 3 illustrates a photovoltaic device using resonating means and absorption means in combination with a gain means and amplification means.

As described above, a portion of photons 315 reflect from DBR mirror 317 back through the gain means 311 and amplifier medium 311 and another portion of photons 315 pass through the DBR mirror 317. The photons 315 that pass through the DBR mirror 317 enter the resonating means 217 and thereafter the absorption means 213. In the embodiment of the device illustrated in FIG. 3, resonating means 217 and absorption means 213 function similarly to the embodiment illustrated in FIG. 2 and described above. Notably, however, the embodiment of the device in FIG. 3 is more efficient due to the highly monochromatic and coherent characteristics of photons 315 as well as their substantially increased intensity configured for optimal absorption by the absorption means 213.

The monochromatic, coherent, and intensity characteristics of photon 315 are matched with the reflective properties of the DBR mirrors 305 and 317. This coupling of characteristics between the photon 315 and the DBR mirrors 305 and 317 allows the generated photons 315 in the amplification means 313 to give rise to higher photon-electron conversion efficiency in the absorption means 213 by means of optimization of the material to suit emission wavelength/energy. Performance inherently increases when spatially uniform and highly intense coherent light is incident on an absorbing medium. The material in the absorption means 213 could be silicon or any other indirect bandgap material listed above. Silicon is an indirect bandgap conductor and it is suited for absorption of photons 315.

Some number of photons will resonate between DBR mirrors 215 and 211 and at each pass, a number of photons 315 will be absorbed in the absorption means 213 producing current 123. Moreover, some number of unabsorbed photons 315 will pass back into the gain means 311 and amplification means 313, where some number of photons will again reflect off DBR mirror 317 into the resonating means 217 and thereafter the absorption means 213. The remaining will generate additional photons 315 in the quantum amplifier 307 and/or resonate between DBR mirrors 303 and 317. In sum, the incoming light/photons 209 continue the cyclic production and resonating of photons 315 produced by the quantum amplifier 307 and reflected by mirrors 303, 317, 211 and 215, creating an avalanching/recycling effect of photons 315 and thereby generating current 123 by the absorption means 213 fed through at least two leads 109 through load 119. The at least two leads 109 can comprise any conductive material.

The load 119 can occur in a wide range of varieties including, but not limited to, a residential load, a commercial load, an electronic device, a portable electronics device, a motorized vehicle, an electrical supply sensors, or an ammeter. In the alternative, the photons 315 can generate current 123 by the absorption means 213 fed through at least two leads 109 through a storage device. The storage device stores the current 123 to be used at a later time.

Figure 4:
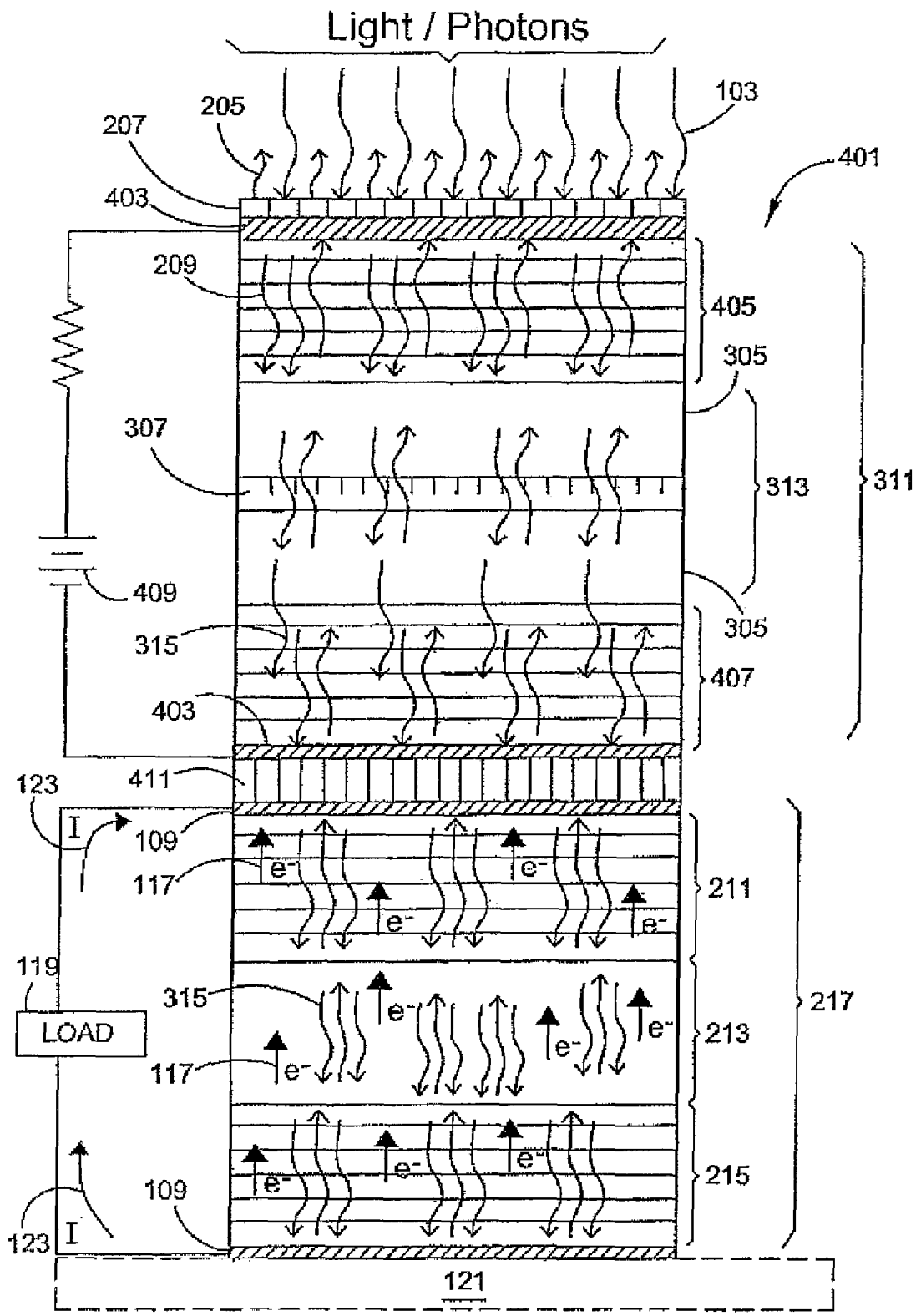
FIG. 4 is an illustration of the device in FIG. 3 in combination with an initiation means.

FIG. 4 illustrates another embodiment 401. This embodiment is similar to the embodiment illustrated in FIG. 3 and disclosed above. In this embodiment 401, the gain means 311 and amplification means 313 uses p-doped DBR mirror 405 and n-doped DBR mirror 407 instead of non-doped or neutral DBR mirrors 303 and 317. This embodiment further employs an initiation means 409. The initiation means 409 includes at least two contacts 403 connected to p-doped DBR mirror 405 and n-doped DBR mirror 407 which are connected to a power supply 409. The at least two contacts 403 can be any conductive material. A power supply 409 can include, but is not limited to, a battery, a capacitor, a fuel cell or other DC power sources. The power supply 409, and above modifications, initiate the ASE process described above by increasing the number of excited electrons associated with quantum amplifier 307. The device of FIG. 4 further includes an isolation means 411, which provides for an optical transparent means and an electrical insulation means. In the preferred embodiment, the isolation means 411 comprises the material of silicon dioxide, however, in the alternative the isolation means can comprise materials including, but not limited to, germanium dioxide, plastic, acrylic, or polyvinyl chloride.

Figure 5:
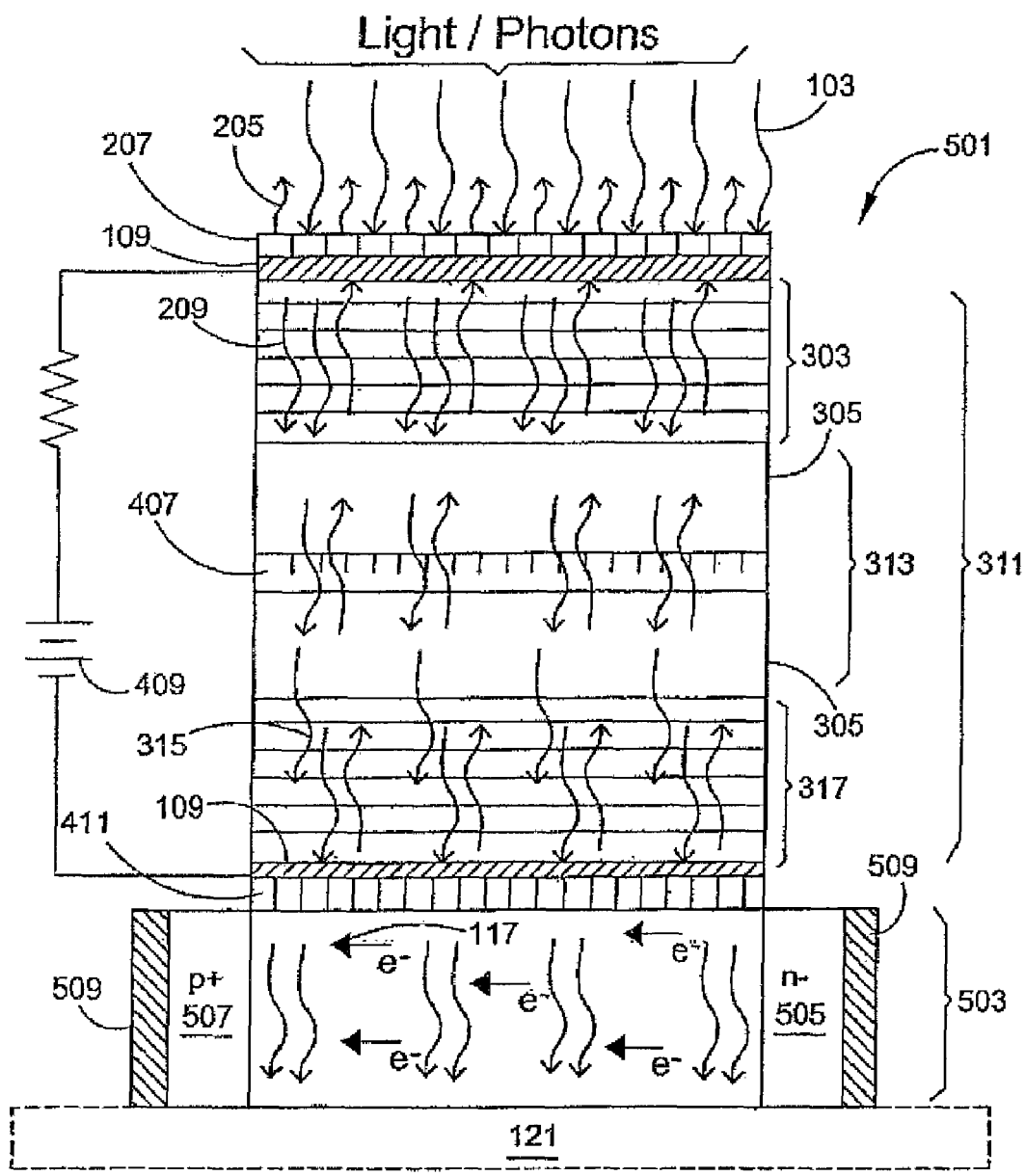
FIG. 5 is an illustration of a photovoltaic device employing a gain means and an amplification means in combination with a bulk absorption means.

FIG. 5 illustrates photovoltaic device 501 having the combination of the gain means 311 and amplification means 313 on the conventional bulk absorption means 503. In this embodiment the amplification and resonating functionality and advantages heretofore described are combined with thicker or relatively "bulk" silicon absorption means 113 juxtaposed between semiconducting p-doped and n-doped materials 507 and 505 respectively. The advantages of more or thicker bulk silicon layer is the aggregate absorption inherent with the size of the absorption region, wherein the sheer size of the material will allow more photons 315 to be absorbed producing electrons 117 and current 123.

The current invention can be applied to many uses. One such use includes a power supply of an electronic device. In such a scenario, multiple photovoltaic devices 301 are arranged together and incorporated into a portable electronic device 601. Upon exposure to sunlight or any ambient light, the photovoltaic devices 301 power the portable electronic device 601 and either eliminate the need of a battery or supplement the battery by continually charging it while exposed to a light source to sustain continued operation. In conjunction with a power supply, a storage device can store power to be used by the electronic device at a later time. While the photovoltaic devices 301 could be incorporated into a non-portable electronic device, the preferred embodiment is a portable electronic device 601 including, but not limited to, a cellular phone, a personal digital assistant (PDA), a personal music player, a microcontroller, a laptop computer, a notebook computer, a camera, a camcorder, or a GPS navigation device.

Figure 11:
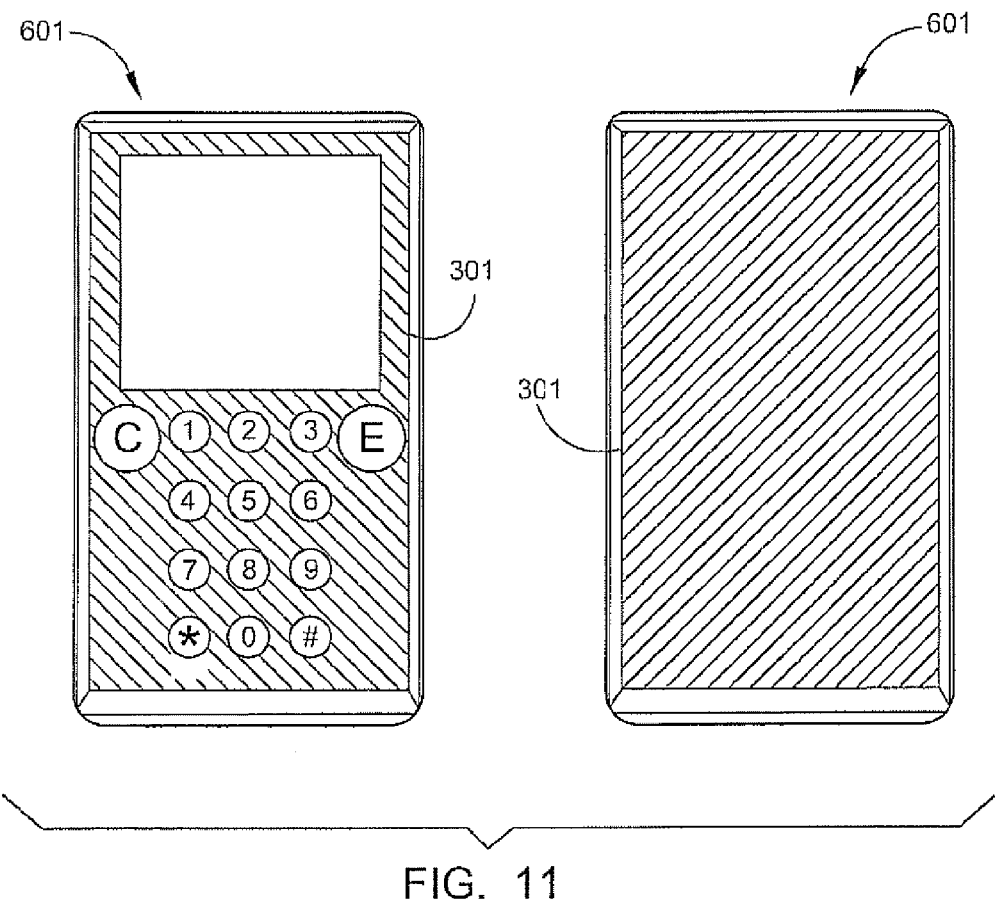
FIG. 11 is an illustration of numerous photovoltaic devices incorporated around the numbers and screen of a portable electronic device and the back panel of a portable electronic device.

The photovoltaic devices 301 could be physically located in multiple arrangements on the electronic device. For example, FIG. 11 shows possible locations of the photovoltaic devices 301 on the portable electronic device 601 including, but not limited to, the back panel of the cellular phone or the front panel of the cellular phone wherein the photovoltaic devices 301 are located between the cellular phone keypads or the cellular phone screen.

While the preferred embodiment includes a portable electronic device 601 comprising of a photovoltaic device consisting of a light filter 207, a gain means 311, an amplification means 313, a resonating means 217, and an absorption means 213, the photovoltaic devices incorporated in the portable electronic device can include any combination of the photovoltaic devices described herein whereby such photovoltaic devices consist of any combination of said photovoltaic device components.

The photovoltaic device could also be used as a detector. The detector can be used as a photodetector 991 whereby said photodetector 991 identifies the presence or intensity of light by sensing light incident on the photodetector 991 and by identifying the intensity of the light via an intensity identifying means incorporated into the photodetector 991. Such a beam can be shown via a light shining means 997 through free-space or any optically transparent material 993 including, but not limited to, an optical fiber or a fiber optic network. The light shining means 997 can include, but is not limited to, a laser. All waveforms of light 995 can be detected by the photodetector 991, including, but not limited to coherent light, incoherent light, visible light, infrared light, or UV light. The photodetector 991 can be placed at any position along the beam of light or optically transparent material. The intensity identifying means includes, but is not limited to, an ammeter and a voltmeter.

Figure 12:
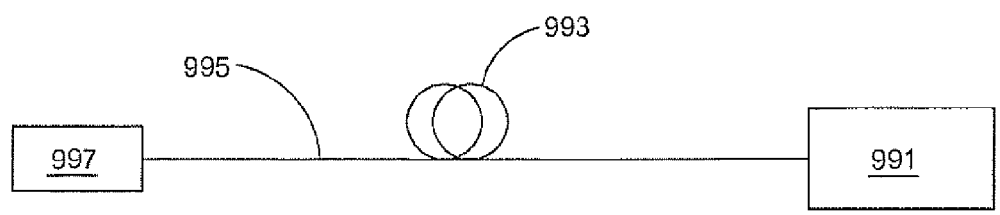
FIG. 12 is an illustration of a photovoltaic device employed as a photodetector.

In the preferred embodiment, as shown in FIG. 12, a photodetector 991 is connected to the end of an optical fiber, wherein light is beamed via a laser through said optic fiber and thereby through the photodetector 991. The photodetector 991 converts the light to electrical current 123 and provides the user with the intensity of the light entering the photodetector 991 via an incorporated ammeter. The intensity of light can be interpolated from the magnitude of current reading and the presence of light is manifested through a small, yet detectable current reading.

While the present invention has been described herein with reference to particular embodiments thereof, a degree of latitude or modification, various changes and substitutions are intended in the foregoing disclosure. It will be appreciated that in some instances some features of the invention will be employed without corresponding use of other features without departing from the spirit and scope of the invention as set forth.

EXAMPLES

The following examples are for illustrative purposes and are not intended to include all potential uses of the present invention.

Example 1

In the preferred embodiment, multiple photovoltaic devices are incorporated into a portable electronic device 601, specifically a cellular phone. Each photovoltaic device includes an infrared filter 207, a gain means 311, an amplification means 313, a resonating means 217, an absorption means 213, wherein said absorption means 213 includes a load 119, and a support means 217.

As shown in FIG. 3, the infrared filter 207 prevents undesirable photons 205 from entering into the photovoltaic device 301 and allows desirable photons 209 to enter into the photovoltaic device 301. As the photons 209 enter into the photovoltaic device 301, they enter into the gain means 311 and amplification means 313. The photons then pass through DBR mirror 303 and enter into the quantum amplifier 307. Photons can either excite an electron from the valence band 705 to the conduction band 703 or pass through the quantum amplifier 307 without exciting an electron. In FIG. 3, the quantum amplifier 307 is a quantum well, comprised of a very thin layer of Gallium Arsenide sandwiched by quantum containment layers 305. Gallium Arsenide is one of a number of direct bandgap materials suitable for the formation of quantum wells and generally quantum amplifiers. The quantum confinement layer 305 is fabricated from the indirect bandgap material Aluminum Gallium Arsenide, having bandgap energy greater than that of the Gallium Arsenide quantum well.

If incident light/photons 209 excite electrons 117 in the quantum amplifier 307 from the valence band 705 to the conduction band 703, the excited electrons 117 will conjugate in the conduction band 703. As the incident light/photons 209 promote an increasing amount of electrons 117 to the conduction band 703, a threshold number of excited electrons 117 is met and the population of excited electrons 117 in the conduction band 703 exceeds the population of unexcited electrons in the valence band 705. Population inversion is thus achieved. At that point electrons 117 in the conduction band 703 move back to the valence band 705 if perturbed by incident photons having at least the equivalent bandgap energy of the material. The resulting energy shift releases a coherent (same phase), monochromatic (same wavelength) intense burst of photons 315. In essence, an incident photon is absorbed, thereby exciting an electron to the conduction band 703 where it resides temporarily. Once population inversion is achieved, any further incident photons will contribute to the process of stimulated emission. When this occurs, an incident photon of sufficient energy will promote the decay of an electron from the conduction band 703 to the valence band 705, thereby releasing a photon of energy equal to that of the incident photon. This implies that the emitted photon has the same wavelength, is coherent, and thus in phase with the incident photon. The cyclic nature of such inversions driven by incident light/photons 209 generates a cloud of electrons 709, which in turn generates an abundant amount of coherent, monochromatic intense burst of photons 315 in the process of ASE.

Referring to FIGS. 10a-f, a flow chart depicting the various routes 1-7 a photon can travel is shown. The flow chart as a whole can be divided by processes 1-7 that may cross-referenced in various points in the flow chart as illustrated. As shown in FIGS. 10a-f, photons 209 that fail to excite an electron 117 and thus pass through the quantum amplifier 307 can be recycled by reflecting photon 209 from n-doped DBR mirror 407 back to the quantum amplifier 307, and thereby allowing the photon 209 another opportunity to excite an electron 117 in a feedback process. The photon can reflect between p-doped DBR mirror 405 and n-doped DBR mirror 407 with the potential to excite an electron 117 in the quantum amplifier 307 until the energy of the photon 209 dissipates.

Also shown in FIG. 3, the excited photons 315 emitted from the quantum amplifier can pass through DBR mirror 317 towards the absorption means 213 and can either enter the resonating means 217 by passing through the p-doped DBR mirror 211 or reflect back into the gain means 311 by reflecting off the p-doped DBR mirror 211. In this example, the p-doped DBR mirror 211 is fabricated to a 0.5 reflection coefficient (i.e. 50% reflective), the n-doped DBR mirror 215 is fabricated to a 1.0 (or practically close thereto) reflection coefficient thereby reflecting about 50% of the light/photons 315. This results in about a 50% reduction in the number of photons 315 passing through p-doped DBR mirror 211. Also in this example, silicon is incorporated into the absorption means 213. As described above, some photons 315 will energize electrons 117 to their conduction band 903 feeding current 123 which is either stored in a battery or fuel cell, or used by the cellular phone.

However, due to practical and physical implications, many photons 315 will not energize electrons 117 and will simply pass through the absorption means 213. Some of photons 315 will excite electrons 117 to their conduction band 903 and produce current 123 and some will pass through the relatively thin layer of the absorption means 213 (fabricated to relatively low thicknesses to allow unabsorbed photons 315 to pass through) and will be reflected back to the absorption means 213 by n-doped DBR mirror 215. Once again some portion of photons 315 will excite electrons 117 in absorption means 213 from their valence band 905 to their conduction band 903, thereby increasing the efficiency of the described device 301. Thereafter, following the reflected photons 315 that did not elevate electrons 117 to their conduction band 903 after initial reflection from n-doped DBR mirror 215, such photons 315 reach the reflective p-doped DBR mirror 211. As such, applying a 0.5 reflection coefficient, about 50% of the light/photons 315 will again reflect toward the absorption means 213 and the above described cycle continues to iterate, until the photons 315 are expended and no longer elevate electrons 117 to their conduction band 903, and/or are absorbed in a form of heat in the impurities of the materials, and/or leave the device 301 through the incremental 50% reflective characteristics of p-doped DBR mirror 211.

The source of light/photons 103 maintaining the photovoltaic process described above, continues to saturate device 301 with new and usable light/photons 209 in combination with the resonating functionality disclosed herein. Finally, as above, the p-doped DBR mirror 211 and n-doped DBR mirror 215 are connected to at least two leads 109 to facilitate the current 123 across a load 119. In all, the disclosed embodiment provides resonating functionality to recycle photons 315 that do not excite electrons 117 from their valence band 905 to their conduction band 903.

Example 2

In an alternative preferred embodiment, the photovoltaic device is connected to the end of an optical fiber or in the free-space propagation path of a beam, wherein light is beamed through said optic fiber (or free-space) and thereby incident on the photodetector. The photodetector converts the light to current and provides the user with the intensity of the light entering the photodetector via a current reading from an incorporated ammeter. Each photovoltaic device includes an infrared filter 207, a gain means 311, an amplification means 313, a resonating means 217, an absorption means 213, wherein said absorption means 213 includes a load 119, an initiation means 409, an isolation means 411, and a support means 121.

In this example, the initiation means 409 is a power supply that starts the flow of electrons between the at least two contacts 403, thereby exciting electrons 117 in the quantum amplifier 307 from the valence band 705 to the conduction band 703.

In addition to the initiation means 409, the infrared filter 207 prevents undesirable photons 205 from entering into the photovoltaic device 301 and allows desirable photons 209 to enter into the photovoltaic device 301. As the photons 209 enter into the photovoltaic device 301, they enter into the gain means 311 and amplification means 313. The photons 209 pass through p-doped DBR mirror 405 and enter into the quantum amplifier 307. Photons can either excite an electron from the valence band 705 to the conduction band 703 or pass through the quantum amplifier 307 without exciting an electron. In this example the quantum amplifier 307 is a group of quantum wires, comprising of a very thin and very narrow layer of Gallium Nitride sandwiched by quantum containment layers 305. Gallium Nitride is one of a number of direct bandgap materials suitable for the formation of quantum wires and generally quantum amplifiers. The quantum confinement layer 305 is fabricated from the direct bandgap material Aluminum Gallium Nitride, having bandgap energy greater than that of the Gallium Nitride quantum wire.

If incident light/photons 209 excite electrons 117 in the quantum amplifier 307 from the valence band 705 to the conduction band 703, the excited electrons 117 will conjugate in the conduction band 703. As the incident light/photons 209 promote an increasing amount of electrons 117 to the conduction band 703, a threshold number of excited electrons 117 is met and the population of excited electrons 117 in the conduction band 703 exceeds the population of unexcited electrons in the valence band 705. At that point electrons 117 in the conduction band 703 move back to the valence band 705 if perturbed by incident photons having at least the equivalent bandgap energy of the material. The resulting energy shift releases a coherent (same phase), monochromatic (same wavelength) intense burst of photons 315. In essence, an incident photon is absorbed, thereby exciting an electron to the conduction band where it resides temporarily. Once population inversion is achieved, any further incident photons will contribute to the process of stimulated emission. When this occurs, an incident photon of sufficient energy will promote the decay of an electron from the conduction band 705 to the valence band 703, thereby releasing a photon of energy equal to that of the incident photon. This implies that the emitted photon has the same wavelength, is coherent, and thus in phase with the incident photon. The cyclic nature of such inversions driven by incident light/photons 209 generates a cloud of electrons 709, which in turn generates an abundant amount of coherent, monochromatic intense burst of photons 315.

In this embodiment, isolation means 411 separates the at least two contacts 403 with the p-doped DBR mirror 211 and comprises the material of silicon dioxide thereby providing optical transparency and electrical insulation. Also shown in FIG. 4, the excited photons 315 emitted from the quantum amplifier can pass through n-doped DBR mirror 407, through the isolation means 411, towards the absorption means 213 and can either enter the resonating means 217 by passing through the p-doped DBR mirror 211 or reflect back into the gain means 311 by reflecting off the p-doped DBR mirror 211. In this example, the p-doped DBR mirror 211 is fabricated to a 0.5 reflection coefficient (i.e. 50% reflective), the n-doped DBR mirror 215 is fabricated to a 1.0 (or practically close thereto) reflection coefficient thereby reflecting about 100% of the light/photons 315. The reflection coefficient results in about a 50% reduction in the number of photons 315 passing through p-doped DBR mirror 211. Also in this example, germanium is incorporated into the absorption means 213. As described above, some photons 315 will energize electrons 117 to their conduction band 903 feeding current 123 which is monitored by ammeter to determine the presence or intensity of light.

However, due to practical and physical implications, many photons 315 will not energize electrons 117 and will simply pass through the absorption means 213. Some of the photons 315 will excite electrons 117 to their conduction band 903 and produce current 123 and some will pass through the relatively thin layer of the absorption means 213 (fabricated to relatively low thicknesses to allow unabsorbed photons 315 to pass through) and will be reflected back to the absorption means 213 by n-doped DBR mirror 215. Once again some portion of photons 315 will excite electrons 117 in absorption means 213 from their valence band 905 to their conduction band 903, thereby increasing the efficiency of the described device 301. Thereafter, following the reflected photons 315 that did not elevate electrons 117 to their conduction band 903 after initial reflection from n-doped DBR mirror 215, such photons 315 reach the reflective p-doped DBR mirror 211. As such, applying a 0.5 reflection coefficient, about 50% of the light/photons 315 will again reflect toward the absorption means 213 and the above described cycle continues to iterate, until the photons 315 are expended and no longer elevate electrons 117 to their conduction band 903, and/or are absorbed in a form of heat in the impurities of the materials, and/or leave the device 301 through the incremental 50% reflective characteristics of p-doped DBR mirror 211.

The source of light/photons 103 maintaining the photovoltaic process described above, continues to saturate device 301 with new and usable light/photons 209 in combination with the resonating functionality disclosed herein. Finally, as above, the p-doped DBR mirror 211 and n-doped DBR mirror 215 are connected to the at least two leads 109 to facilitate the flow of current 123 across a load 119. In all, the disclosed embodiment provides resonating functionality to recycle photons 315 that do not excite electrons 117 from their valence band 905 to their conduction band 903.

The invention claimed is:

1. A photovoltaic cell comprising:
a positive lead for connecting to a load;
a first DBR (Distributed Bragg Reflector) mirror connected to the positive lead and configured on top of the positive lead, the first DBR mirror further comprising n-doped semiconductor material;
an absorption region configured on top of and juxtaposed to the first DBR mirror;
a second DBR mirror configured on top of and juxtaposed to the absorption region, the second DBR mirror further comprising p-doped semiconductor material;
a negative lead for connecting to a load, the negative lead configured on top of the second DBR mirror; and
an amplification and gain region configured directly above the negative lead, the amplification and gain region for receiving incident photons, and thereby configuring the photovoltaic cell as a single stack, the amplification and gain region further comprising a quantum amplifier connected above the negative lead for receiving incident photons.

2. The photovoltaic cell of claim 1 wherein the absorption region comprises indirect bandgap semiconductor material.

3. The photovoltaic cell of claim 1,
wherein the quantum amplifier comprises a direct bandgap semiconductor material; and further wherein the amplification and gain region comprises
first and second quantum confinement layers (QCLs) on opposing sides of the quantum amplifier.

4. The photovoltaic cell of claim 1 wherein the quantum amplifier material further comprises undoped semiconductor material.

5. The photovoltaic cell of claim 3, wherein the amplification and gain region further comprises third and fourth DBR mirrors configured on opposing sides of the first and second confinement layers, respectively, and wherein an aggregate electron cloud is formed at the quantum amplifier, and wherein generated photons are formed as electrons move from a conduction band to a valence band of the quantum amplifier, and wherein the incident photons added to the generated photons produces photons of greater intensity that further comprise coherent (uniform phase) and monochromatic (same wavelength) properties, and wherein the absorption region is specifically designed to optimally absorb photons at or near a monochromatic wavelength.

6. The photovoltaic cell of claim 3 wherein the quantum amplifier is relatively thin as compared to the first and second quantum confinement layers, and wherein the quantum amplifier has a thickness of approximately 100 angstrom.

7. The photovoltaic cell of claim 1 further comprising a light filter on top of the amplification and gain region.

8. A photovoltaic cell comprising:
a positive lead for connecting to a load;
a first DBR (Distributed Bragg Reflector) mirror connected to the positive lead and configured on top of the positive lead, the first DBR mirror further comprising n-doped semiconductor material;
an absorption region configured on top of and juxtaposed to the first DBR mirror;
a second DBR mirror configured on top of and juxtaposed to the absorption region, the second DBR mirror;
a negative lead for connecting to a load, the negative lead configured on top of the second DBR mirror; and
a quantum amplifier connected above the negative lead for receiving incident photons, the quantum amplifier further comprising undoped semiconductor material.

9. The photovoltaic cell of claim 8, further comprising first and second quantum confinement layers (QCLs) on opposing sides of the quantum amplifier.

10. The photovoltaic cell of claim 9, further comprising third and fourth DBR mirrors configured on opposing sides of the first and second confinement layers, respectively, and wherein an aggregate electron cloud is formed at the quantum amplifier, and wherein generated photons are formed as electrons move from a conduction band to a valence band of the quantum amplifier, and wherein the incident photons added to the generated photons produces photons of greater intensity that further comprise coherent (uniform phase) and monochromatic (same wavelength) properties, and wherein the absorption region is specifically designed to optimally absorb photons at or near a monochromatic wavelength.

11. The photovoltaic cell of claim 10, wherein the third and fourth DBR mirrors are n-doped and p-doped respectively, the photovoltaic cell further comprising a power supply providing electric potential across the quantum amplifier, QCLs, and the third and fourth DBR mirrors, wherein the electrical potential assists in initiation to the quantum amplifier.

12. The photovoltaic cell of claim 11, further comprising an isolation layer between the second and third DBR mirrors, the isolation layer further comprising material that is optically transparent and electrically insulative.

13. A photovoltaic cell comprising:
an absorption region comprising semiconductor material;
an amplification and gain region configured above the absorption region for receiving incident photons; and
p-doped and n-doped material on opposing lateral sides of the absorption region wherein photons absorbed in the absorption region result in an electrical potential across the p-doped and n-doped material together with the absorption region, further wherein the amplification and gain region comprises a quantum amplifier connected above a negative lead for receiving incident photons.

14. The photovoltaic cell of claim 13, wherein the quantum amplifier comprises direct bandgap semiconductor material; and wherein the amplification and gain region further comprises
first and second quantum confinement layers (QCLs) on opposing sides of the quantum amplifier.

15. The photovoltaic cell of claim 14, wherein the amplification and gain region further comprises first and second DBR mirrors configured on opposing sides of the first and second quantum confinement layers, respectively, and wherein an aggregate electron cloud is formed at the quantum amplifier, and wherein generated photons are formed as electrons move from a conduction band to a valence band of the quantum amplifier, and wherein the incident photons added to the generated photons produces photons of greater intensity that further comprise coherent (uniform phase) and monochromatic (same wavelength) properties, and wherein the absorption region is specifically designed to optimally absorb photons at or near a monochromatic wavelength.

16. The photovoltaic cell of claim 14, wherein the first and second DBR mirrors are n-doped and p-doped respectively, the photovoltaic cell further comprising a power supply providing electric potential across the quantum amplifier, QCLs, and the first and second DBR mirrors, wherein the electrical potential assists in initiation to the quantum amplifier.

17. The photovoltaic cell of claim 16, further comprising an isolation layer between the absorption region and first DBR mirror, the isolation layer further comprising material that is optically transparent and electrically insulative.

* * * * *